United States Patent
Otsuka et al.

(10) Patent No.: US 7,819,172 B2
(45) Date of Patent: Oct. 26, 2010

(54) COOLING APPARATUS FOR VEHICLE ELECTRICAL PACKAGING UNIT

(75) Inventors: Hiroshi Otsuka, Wako (JP); Hiroo Yamaguchi, Wako (JP); Tomohiro Fukazu, Wako (JP); Masanobu Nakatsu, Wako (JP); Yasushi Ogihara, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 864 days.

(21) Appl. No.: 11/476,583

(22) Filed: Jun. 29, 2006

(65) Prior Publication Data
US 2007/0000231 A1    Jan. 4, 2007

(30) Foreign Application Priority Data
Jul. 4, 2005    (JP) ............................. 2005-194733

(51) Int. Cl.
*F28F 7/00* (2006.01)
*H05K 7/20* (2006.01)

(52) U.S. Cl. ..................................... 165/80.3; 361/704

(58) Field of Classification Search ............... 60/203.1; 165/41, 80.3, 185, 104.33, 104.34, 121, 122; 361/696, 697, 704
See application file for complete search history.

(56) References Cited

U.S. PATENT DOCUMENTS

| | | | | |
|---|---|---|---|---|
| 3,766,977 | A * | 10/1973 | Pravda et al. | ................... 165/47 |
| 6,094,927 | A * | 8/2000 | Anazawa et al. | ................ 62/239 |
| 2004/0235315 | A1* | 11/2004 | Masui et al. | ................... 439/34 |
| 2005/0111167 | A1* | 5/2005 | Yamaguchi et al. | ......... 361/676 |
| 2005/0241808 | A1* | 11/2005 | Lee et al. | ................ 165/104.33 |

FOREIGN PATENT DOCUMENTS

| | | |
|---|---|---|
| JP | 07067213 A | 3/1995 |
| JP | 2001-20737 (A) | 1/2001 |
| JP | 2001163065 A | 6/2001 |
| JP | 2003-79003 (A) | 3/2003 |
| JP | 2003-112531 (A) | 4/2003 |
| JP | 2003178815 A | 6/2003 |
| JP | 2005-178732 (A) | 7/2005 |

OTHER PUBLICATIONS

Japanese Office Action date May 18, 2010, issued in corresponding Japanese Patent Application No. 2005-194733.

* cited by examiner

*Primary Examiner*—Tho V Duong
(74) *Attorney, Agent, or Firm*—Westerman, Hattori, Daniels & Adrian, LLP (57) ABSTRACT

A cooling apparatus for a vehicle electrical packaging unit that includes an inverter for a vehicle drive motor, a DC-DC converter for a vehicle control power source, and an electrical power converter for driving the electrical accessories, and cools them by heat exchange with cooling air. The cooling apparatus includes a first heat radiating plate for the inverter, a second heat radiating plate for the DC-DC converter, a third heat radiating plate for the electrical power converter, and connecting members that respectively connect the first heat radiating plate to the second heat radiating plate and the first heat radiating plate to the third heat radiating plate. Heat radiating fins of the first to third heat radiating plates are enclosed by the first heat radiating plate, second heat radiating plate, the third heat radiating plate, and the connecting members to form an air passage through which the cooling air passes.

9 Claims, 12 Drawing Sheets

COOLING APPARATUS FOR VEHICLE ELECTRICAL PACKAGING UNIT

BACKGROUND OF THE INVENTION

1. Field of the Invention

The present invention relates to a cooling apparatus for a vehicle electrical packaging unit that includes an inverter for driving a vehicle driving motor, a DC-DC converter for a vehicle control electric power source, an electrical power converter for driving electrical accessories, and other high voltage electrical devices, and in particular, relates to a cooling apparatus for a vehicle electrical packaging unit that cools a plurality of high voltage electrical devices by heat exchange with cooling air.

Priority is claimed on Japanese Patent Application No. 2005-194733, filed Jul. 4, 2005, the content of which is incorporated herein by reference.

2. Description of Related Art

In electrical automobiles and so-called hybrid vehicles, high voltage electrical devices, such as high voltage electrical devices include an inverter for a vehicle drive motor, a DC-DC converter for a vehicle control electric power source, and an inverter for driving electrical accessories, that generate heat are mounted in plurality. These types of high voltage electrical devices are disposed together along with batteries in an electrical packaging box as an integrated unit, and the heat of the high voltage electrical devices and the like that generate heat inside the electrical packaging box is cooled by air drawn into the electrical packaging box by a fan.

Figure 14:
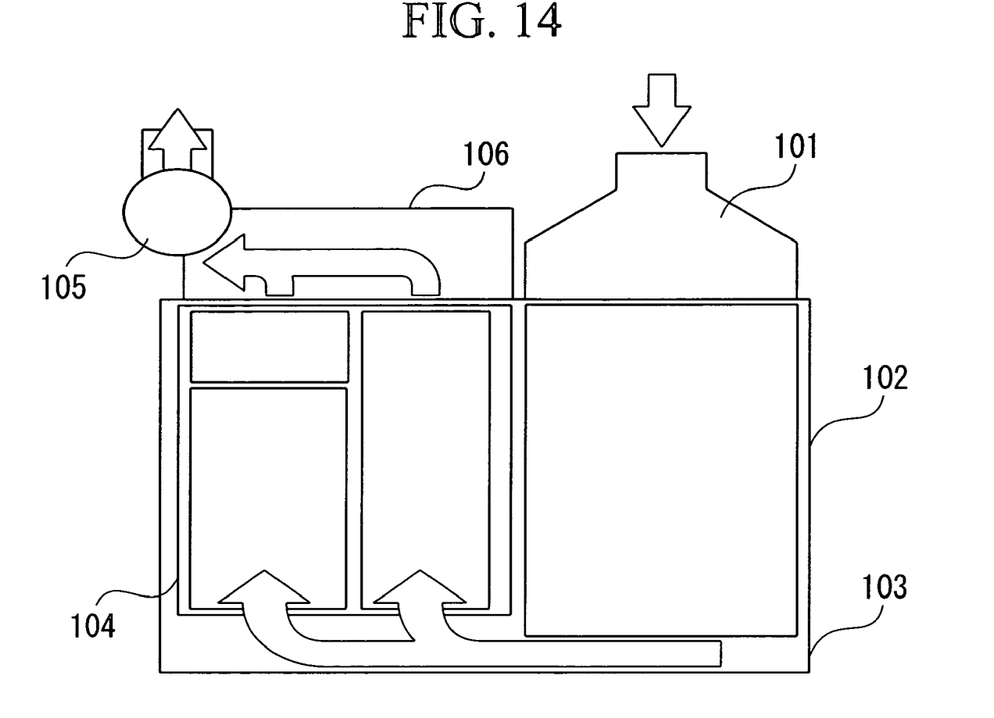
FIG. 14 shows prior art technology, and is a drawing showing schematically the disposition of the parts in an electrical packaging box.

For example, when the electrical packaging box is disposed behind a back seat, as shown in FIG. 14, cooling air inside the passenger compartment is guided to a battery 103 and an electrical packaging unit 104 inside an electrical packaging box 102 through an intake duct 101 that opens in the rear parcel shelf, and then the cooling air is guided outside the electrical packaging box 102 through a discharge duct 106 connected to a suction fan 105 (refer, for example, to Japanese Unexamined Patent Application, First Publication No. 2003-79003).

Figure 15:
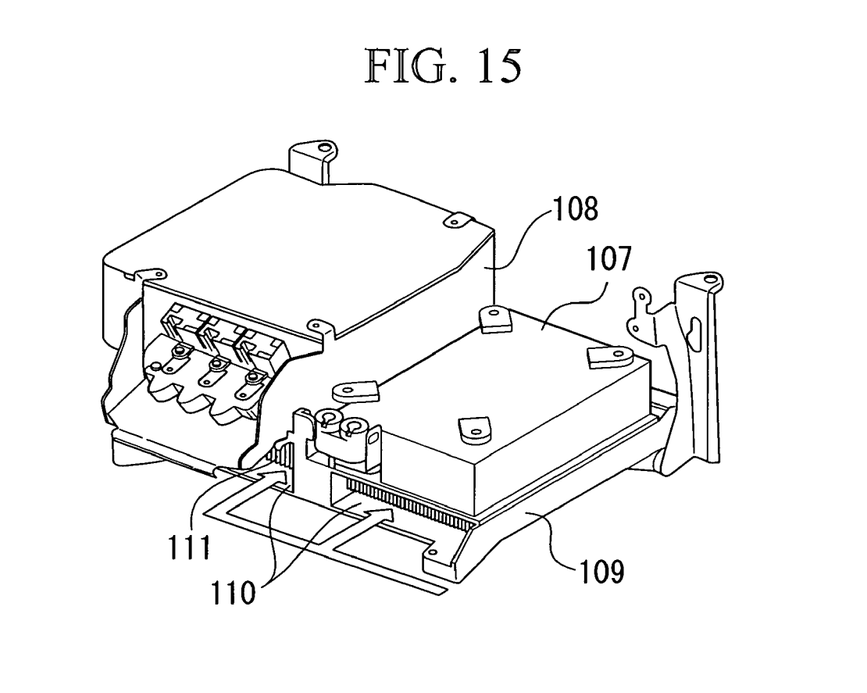
FIG. 15 shows prior art technology, and is a perspective view of a cooling apparatus.

In addition, a cooling apparatus for the electrical packaging unit described above has been developed and widely used in which, as shown in FIG. 15, a passage 110 for the cooling air is formed in a heat sink case 109 installed in contact with the high voltage electrical devices 107 and 108, and heat radiating fins 111 are integrally formed in the passage 110.

However, in this conventional cooling apparatus, the heat sink case 109 is integrally formed by die casting or the like, and thus there are disadvantages in that the fabrication for forming the passage 110 and the heat radiating fins 111 therein is difficult, and a space-saving and concentrated arrangement of the high voltage electrical devices 107 and 108 in the pre-molded heat sink case 109 is difficult.

SUMMARY OF THE INVENTION

Thus, it is an object of the present invention to provide a cooling apparatus for a vehicle electrical packaging unit that enables a reduction in fabrication cost and increased compactness by using parts that are easily fabricated, and by realizing a space-saving and concentrated arrangement of the high voltage electrical devices, including, for example, an inverter for a vehicle drive motor and a DC-DC converter for a vehicle control power source.

In order to resolve the problems described above, the present invention is a cooling apparatus for a vehicle electrical packaging unit that introduces cooling air into an electrical packaging unit that includes an inverter for a vehicle drive motor, a DC-DC converter for a vehicle control power source, and an electrical power converter for driving the electrical accessories, and cools the inverter for the vehicle drive motor, the DC-DC converter for the vehicle control power source, and the electrical power converter for driving the electrical accessories by heat exchange with the cooling air. The cooling apparatus includes: a first heat radiating plate that is installed on the inverter for the vehicle drive motor and is provided with heat radiating fins on a back surface thereof, a second heat radiating plate that is installed on the DC-DC converter for the vehicle control power supply, is provided with heat radiating fins on a back side thereof, and is disposed so as to oppose the first heat radiating plate, a third heat radiating plate that is installed on the electrical power converter for driving the electrical accessories, is provided with heat radiating fins on a back side thereof, and is disposed so as to oppose the first heat radiating plate and downstream of the second heat radiating plate when viewed in a direction of flow of the cooling air, and connecting members that respectively connect the first heat radiating plate to the second heat radiating plate and the first heat radiating plate to the third heat radiating plate, and each of the heat radiating fins is enclosed by the first heat radiating plate, the second heat radiating plate, the third heat radiating plate, and the connecting members to form an air passage through which the cooling air passes.

According to the structure described above, when the cooling air is introduced into the air passage formed by the heat radiating plates and the connecting members, heat exchange between the cooling air and each of the high voltage electrical devices (the inverter for the vehicle drive motor, the DC-DC converter for the vehicle control power source, and the electrical power converter for driving the electrical accessories) takes place at the heat radiating fins of the heat radiating plates disposed with back sides facing each other. The DC-DC converter for the vehicle control power source carries out efficient heat exchange with the low temperature cooling air through the heat radiating plates at a position upstream of the air passage. In addition, the high voltage electrical devices may have been independently attached to respective heat radiating plates at a stage that precedes the joining of the heat radiating plates to the connecting members, and after the connecting members have been joined, the heat radiating plates of the different high voltage electrical devices are arranged in a concentrated manner at opposing positions so as to have the air passage for cooling air therebetween.

The cooling apparatus for a vehicle electrical packaging unit described above may further include a low heat radiating parts accommodating portion that is disposed at an area downstream of the air passage and projects from an end portion of one of the first heat radiating plate and the third heat radiating plate, and a suction fan for introducing cooling air that is adjacent to the other end portion of the first heat radiating plate and the third heat radiating plate and disposed so as to oppose the low heat radiating parts accommodating portion.

According to the structure described above, at a position opposed to the low heat radiating parts accommodating portion of the high voltage electrical devices extending so as to project beyond an end portion of one of the heat radiating plates, a suction fan is disposed substantially side-by-side to the high voltage electrical devices on the other heat radiating plate side.

The cooling apparatus of the vehicle electrical packaging unit described above may further include a duct disposed on an extension of the first heat radiating plate and the second heat radiating plate to connect the air passage and the suction fan, and a fan body of the suction fan may be disposed so as to be adjacent to a side portion of either one of the inverter for the vehicle drive motor and the electrical power converter for driving the electrical accessories.

According to the structure described above, the fan body of the suction fan is disposed side-by-side while in contact with the high voltage electrical devices of the other heat radiating plates side.

The cooling apparatus for a vehicle electrical packaging unit described above may further include a discharge duct that is formed integrally with the housing of the suction fan and that evacuates the cooling air.

According to the structure described above, it is not necessary to connect a separate discharge duct to the suction fan.

A frame for attaching at least one of the inverter for the vehicle drive motor, the DC-DC converter for the vehicle control power source, and the electrical power converter for driving the electrical accessories to another part may be integrally formed with at least one of the connecting members.

According to the structure described above, the installation of the high voltage electrical devices on the frame and the formation of the air passage are completed by installing the high voltage electrical devices on the heat radiating plates and joining the heat radiating plates to the connecting members provided integrally with the frame.

According to the present invention, because the passage for cooling air is formed by using easily manufactured heat radiating plates and connecting members as the main parts, and at the stage prior to joining the heat radiating plates to the connecting members, the high voltage electrical devices can be easily and independently attached to the heat radiating plates, and furthermore, because the heat radiating plates of the differing high voltage electrical devices can be arranged in a concentrated manner at opposing positions so as to have the passage for the cooling air therebetween, it is possible to obtain the basic effects that manufacturing costs can be reduced and that the apparatus can be made compact.

In addition, in this invention, because the DC-DC converter that supplies electric power used in vehicle control carries out efficient heat exchange through heat radiating plates upstream of the passage in which the cooling air has a low temperature, the DC-DC converter itself and the heat radiating plate can be made compact. In addition, the reliability of the vehicle control electric power source can be further increased.

In addition, according to the present invention, because the low heat radiating parts accommodating portion for the high voltage electrical devices is disposed so as to project from an end portion of one of the heat radiating plates while the suction fan is disposed so as to face to the low heat radiating parts accommodating portion on a side adjacent to an end portion of the other heat radiating plate, the suction fan can be compactly disposed and the overall apparatus can be made compact.

Furthermore, according to the present invention, the overall apparatus can be made more compact because the duct is disposed in the space above the extension of the heat radiating plate opposed to the duct, and the fan body of the suction fan can be disposed in sufficient contact with the side portion of the high voltage electrical devices on the other heat radiating plate side.

In addition, according to the present invention, reductions in the fabrication cost due to reducing the number of parts and further compactness of the apparatus can be realized because the discharge duct is integrally formed with the housing of the suction fan, and thereby a separate discharge duct does not need to be connected to the suction fan.

In addition, according to the present invention, because the passage can be formed at the same time as the installation of the high voltage electrical devices in the frame because the high voltage electrical devices are installed on the heat radiating plates and each of the heat radiating plates is joined to the connecting members provided integrally to the frame, the fabrication of the apparatus is simplified and a reduction in fabrication cost is possible.

DETAILED DESCRIPTION OF THE INVENTION

Below, a first embodiment of the present invention will be explained with reference to FIG. 1 to FIG. 10. Note that, unless otherwise specified, the longitudinal and transverse orientations in the following explanations are identical to the orientations in the vehicle. In addition, the arrow FR in the diagrams is oriented toward the front of the vehicle and the arrow LH is oriented toward the left of the vehicle.

Figure 1:
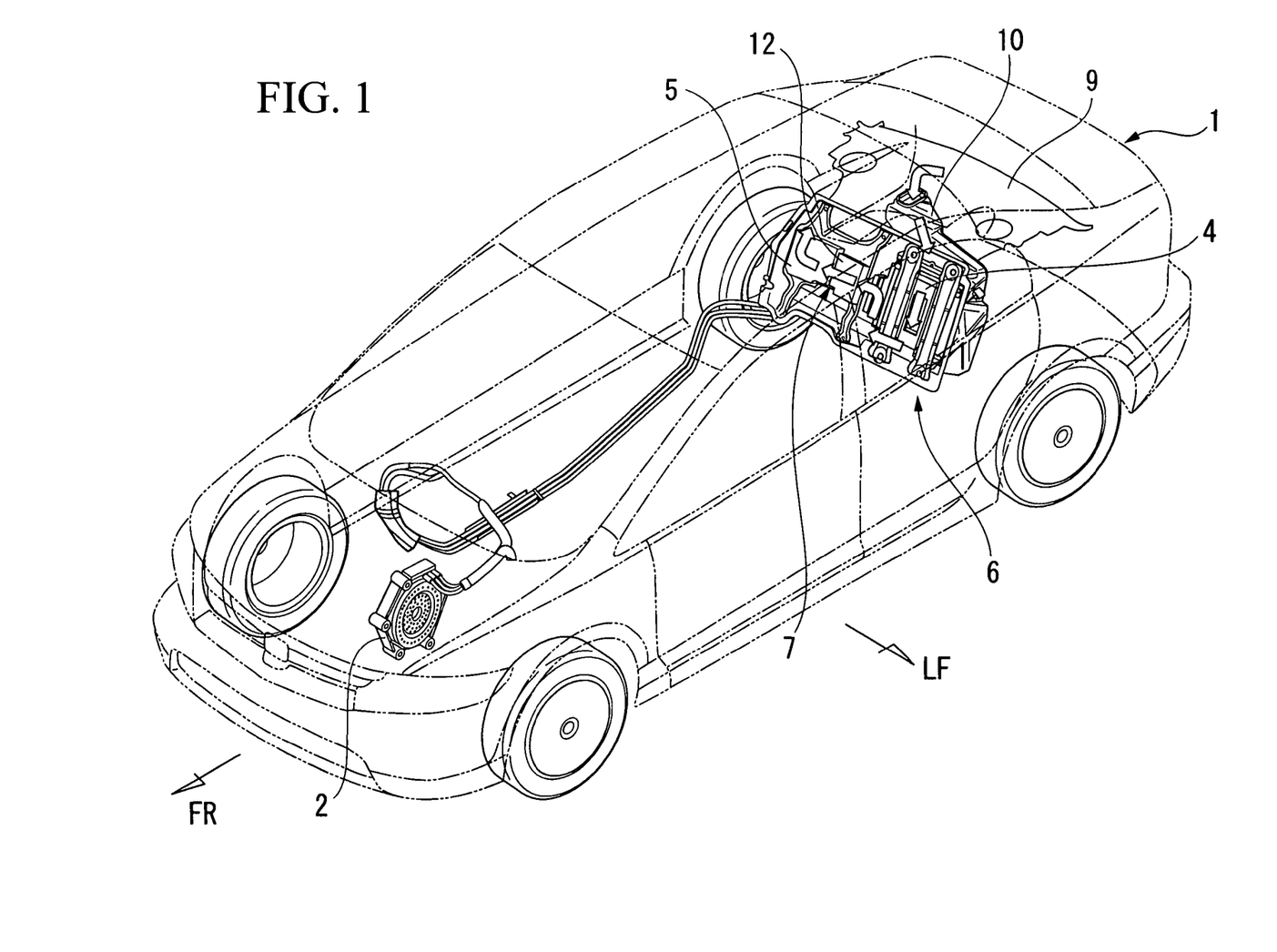
FIG. 1 is a perspective view for explaining the disposition of an electrical packaging box in a first embodiment of the present invention.

FIG. 1 shows a hybrid vehicle 1 in which a cooling apparatus for an electrical packaging unit according to the present invention has been applied. The hybrid vehicle 1 is a so-called parallel type hybrid vehicle. The engine (not illustrated) and a motor-generator 2 (the vehicle drive motor) are connected serially, and the driving force thereof is transferred to the driving wheels via a transmission (not illustrated). Note that the motor-generator 2 is structured by a three-phase brushless DC motor.

In addition, in the hybrid vehicle 1, when the driving force is transferred to the motor-generator 2 from the front wheels during deceleration and the like, the motor-generator 2 functions as a generator to recover the energy as so-called regenerative breaking power. The recovered electrical energy recharges a high voltage battery 4 via a PDU (power drive unit) 3 described below (refer to FIG. 4 and FIG. 5). Note that the PDU 3 includes an inverter as a main part. While the vehicle is being driven by the motor-generator 2, the PDU 3 receives a direct current from the high voltage battery 4, and converts the direct current to a three-phase alternating current. Additionally, the PDU 3 converts an alternating current generated by the motor-generator 2 while the vehicle is breaking to direct current.

In addition, a compressor (not illustrated) for an air conditioner (air conditioning apparatus) driven by a motor is disposed in the engine compartment. The motor of the compressor is a three-phase alternating current motor, and supplies the electrical power from the inverter 5 for the compressor (an electrical power converter for driving the electrical accessories, below referred to as the "air conditioner inverter 5") while the vehicle is traveling.

Figure 2:
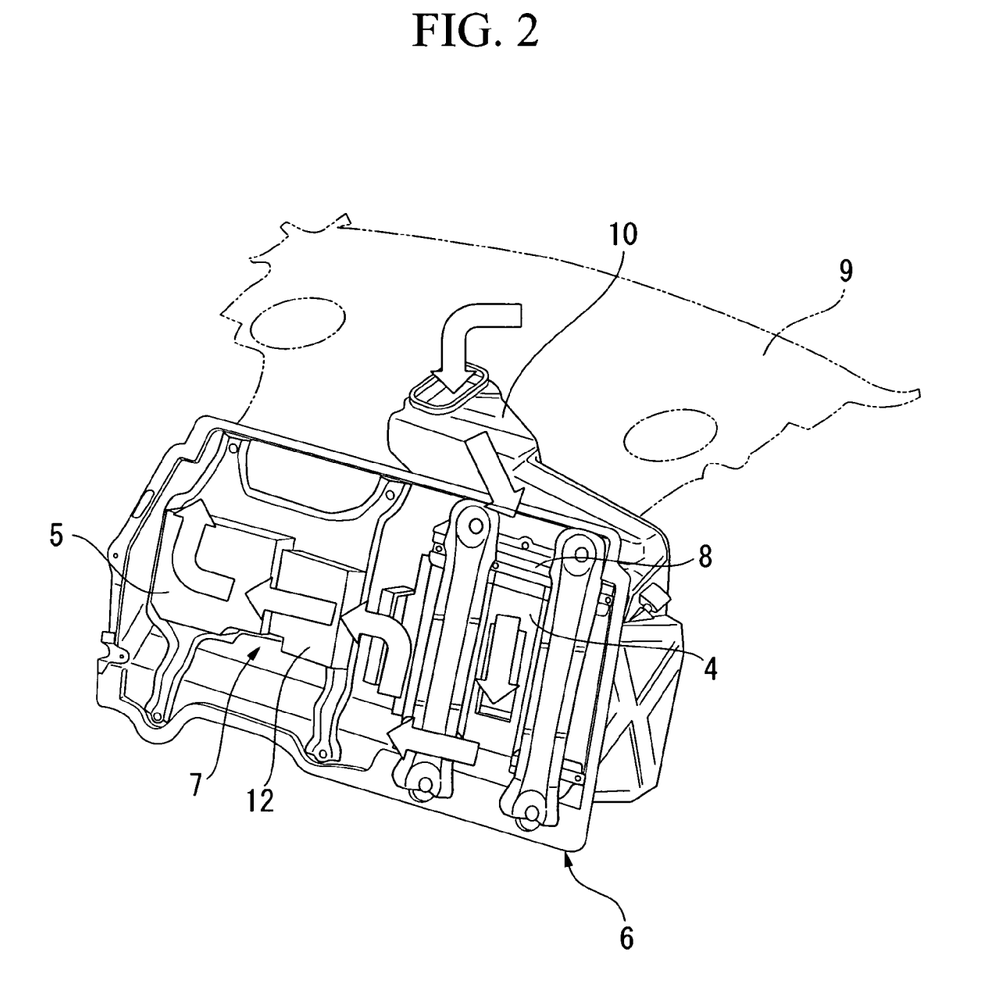
FIG. 2 is a drawing of the same embodiment, and is perspective view, in which the main parts of FIG. 1 have been enlarged.
Figure 3:
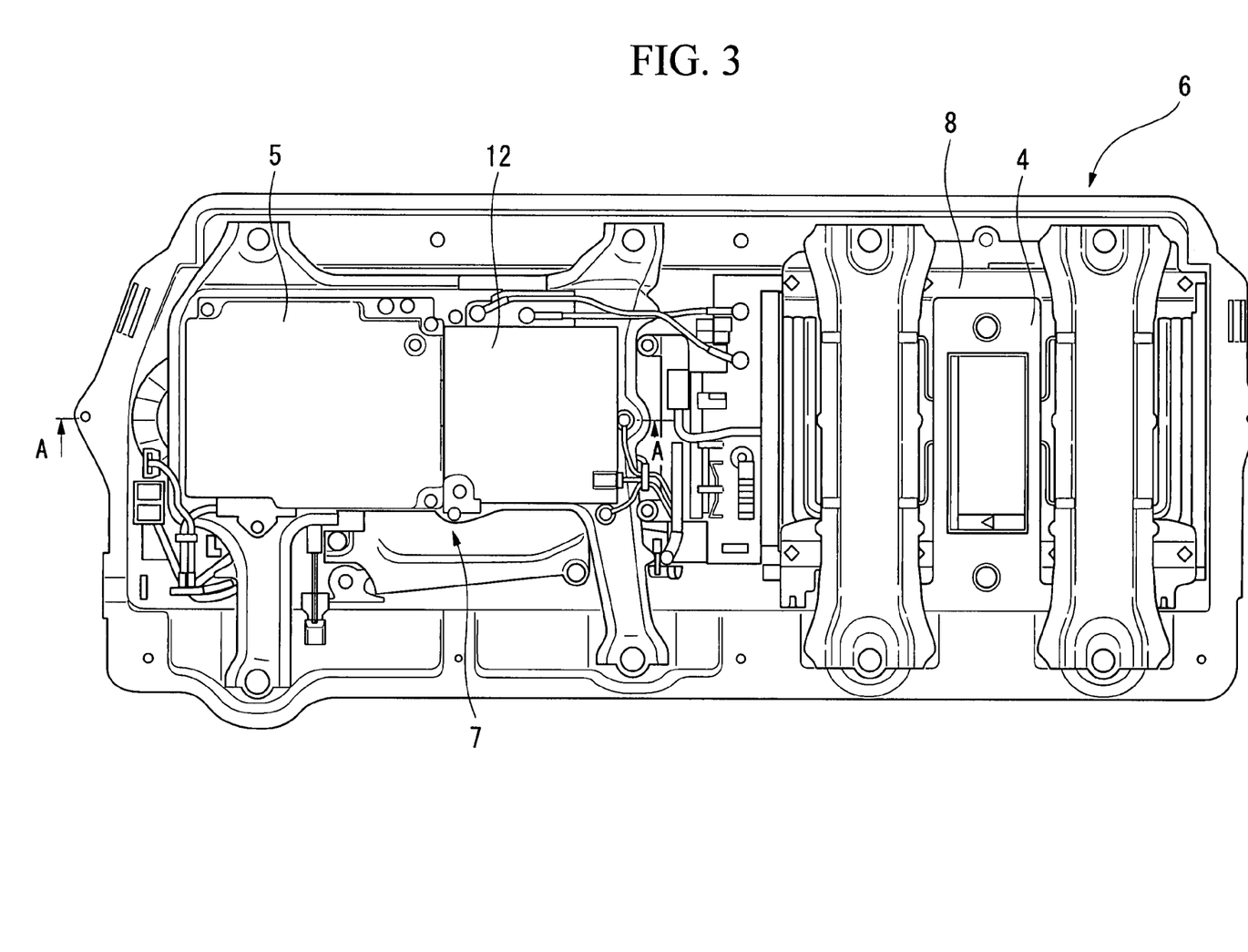
FIG. 3 is a drawing showing the same embodiment, and is front view of an electrical packaging box.

A electrical packaging box 6 is disposed at the back surface side of a seatback (not illustrated) of the rear seat. As shown in FIG. 1 to FIG. 3, the electrical packaging box 6 is formed in a substantially rectangular shape. The high voltage battery 4 and the electrical packaging unit 7 are accommodated therein. In the electrical packaging unit 7, the high voltage electrical devices such as the PDU 3, the air conditioner inverter 5, and the like are compactly disposed together.

In addition, the high voltage battery 4 disposed in the electrical packaging box 6 is formed by columnar battery units being disposed in plurality in a battery case 8 (refer to FIG. 2 and FIG. 3), the cooling air is drawn therein from an upper opening 8a (refer to FIG. 9) of the battery case 8, and the air that has completed heat exchange with the battery 4 is evacuated from a lower opening 8b (refer to FIG. 9) of the battery case 8. The air that has been introduced into the battery 8 is drawn in from the passenger compartment through a suction duct 10 having one end that opens in the rear parcel shelf 9. In addition, the lower opening 8b of the battery case 8 is connected to one end of the passage in the electrical packaging unit 7 through an inner passage of the electrical packaging box 6, and the other end of the passage in the electrical packaging unit 7 is connected to a suction fan 11 (refer to FIG. 4). The cooling air in the passenger compartment that is drawn in by the suction fan 11 carries out heat exchange between the battery 4 and the plurality of high voltage electrical devices (the PDU 3, the air conditioner inverter 5, and the like) while passing through the electrical packaging box 6.

In addition to high voltage devices such as the PDU 3 and the air conditioner inverter 5, the electrical packaging unit 7 in the embodiment includes a DC-DC converter 12 (refer to FIG. 4), which supplies voltage for the vehicle control electric power source. In order to recharge a low voltage battery 80 (refer to FIG. 10) for vehicle control, the operation of the electrical accessories, and the like, with the high voltage power generated by the motor-generator 2, the DC-DC converter 12 steps the produced voltage down to the rated voltage (for example, 12 V) of the low voltage battery 80.

Figure 10:
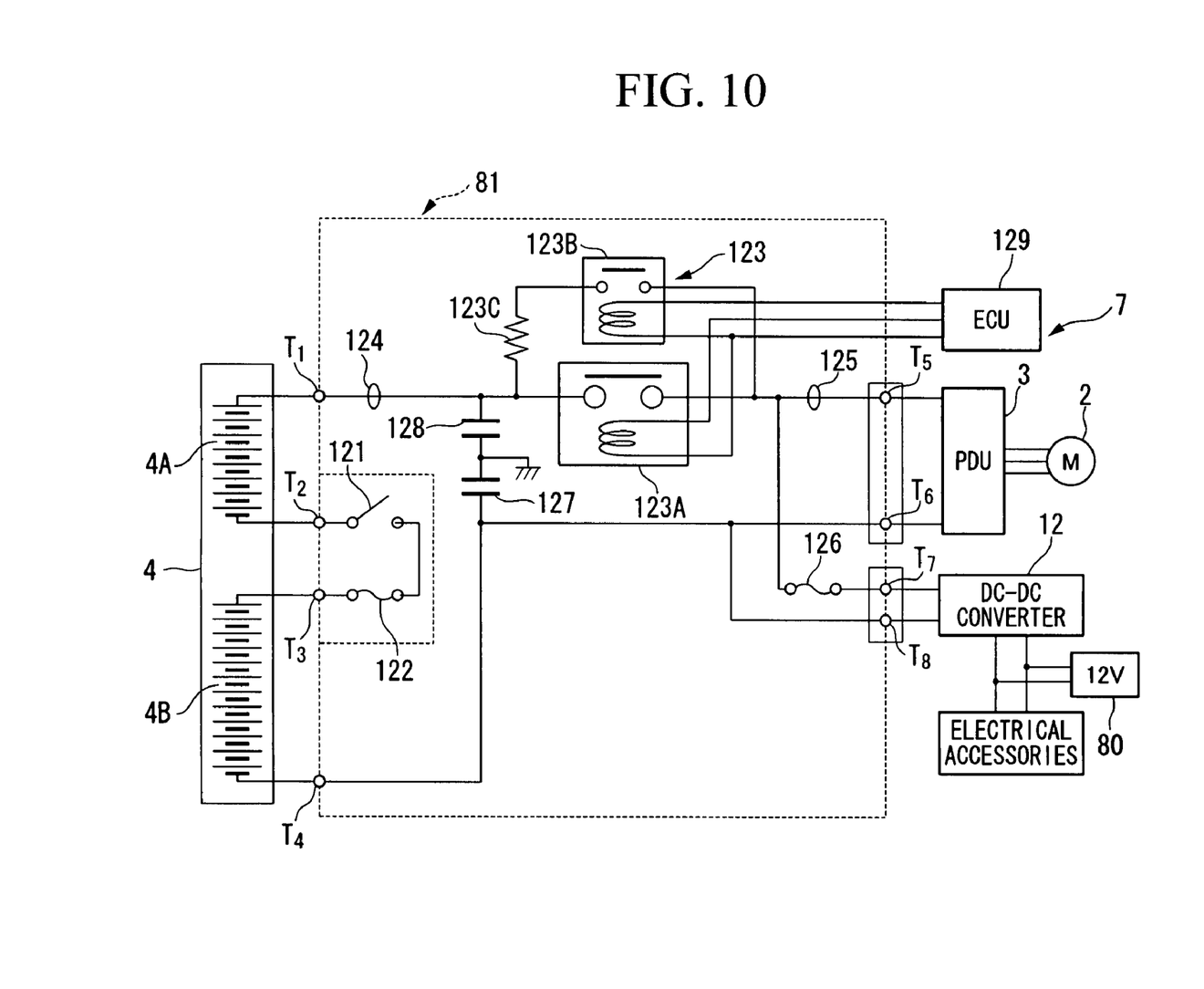
FIG. 10 is a drawing showing the wiring of the main parts of the electrical packaging unit of the same embodiment.

Here, the wiring of the main parts of the electrical packaging unit 7 shown in FIG. 10 will be simply explained.

FIG. 10 shows the connection configuration between the high voltage battery 4, the high voltage devices (PDU 3, DC-DC converter 12), and the other peripheral devices, with an electrical power source protection circuit 81 on the circuit substrate at the center. The electric power source protection circuit 81 is structured such that the high voltage battery 4 and the high voltage electrical devices are connected via a contactor 123, and the contactor 123 protects against excess current by carrying out appropriate opening and closing of the circuit and current regulation.

The high voltage battery 4 includes a first module 4A and a second module 4B, and both of the modules 4A and 4B are connected in series by a main switch 121 and a main fuse 122. In addition, the high voltage battery 4 (the first module 4A and the second module 4B) is connected via terminals T1 to T4 to the substrate of the electric power source protecting circuit 81. In contrast, the substrate of the electric power source protecting circuit 81 is connected via terminals T5 to T8 to the PDU 3, which is a high voltage electrical device, and the DC-DC converter 12. The PDU 3 and the DC-DC converter 12 are connected in parallel to the high voltage battery 4 via the electric power source protecting circuit 81.

The contactor 123 described above is interposed between the plus terminal T1 on the high voltage battery 4 side and the terminals T5 and T7 on the PDU 3 and the DC-DC converter 12 side. The contactor 123 is structured by a main contactor 123A and a precharge contactor 123B and a precharge resistor 123C that are connected in parallel to the main contactor 123A, and the main contactor 123A and the precharge contactor 123B are appropriately controlled by a battery ECU 129 according to the state of the vehicle. A battery current sensor 124 that detects the current flowing from the high voltage battery 4 is provided between the terminal T1 and the contactor 123, and a PDU current sensor 125 that detects the current output by the PDU 3 is provided between the contactor 123 and the terminal T5. Furthermore, a DC-DC converter fuse 126 that affords the short circuit protection for the DC-DC converter 12 is provided between the contactor 123 and the terminal T7.

In addition, the minus terminal T4 on the high voltage battery 4 side, terminal T6 on the PDU 3 side, and the terminal T8 on the DC-DC converter 12 side are connected to an earth via the capacitor 127 for radio noise reduction, and similarly, the terminal T1 is grounded via the capacitor 128 for radio noise reduction.

In addition, the low voltage battery 80 is connected to the output side of the electric power source protecting circuit 81 via the DC-DC converter 12, and is recharged after the power generated by the motor-generator 2, which has been transformed to direct current by the PDU 3, has been stepped down by the DC-DC converter 12. In addition, the low voltage battery 80 is provided for use as an electric power source to the battery ECU 129 and other controllers for vehicle control, and to the electrical accessories.

Note that the high voltage battery 4 is connected to the PDU 3 and the DC-DC converter 12 by turning on a main switch 121. However, in this situation, the precharge circuit is closed by first turning ON the precharge contactor 123B by a command from the battery ECU 129, and subsequently the main circuit is closed by turning ON the main contactor 123B. Thereby, fusing of the main contactor 123A is prevented because the current is limited by the precharge circuit when the main switch 121 is first turned on.

The structure of the electrical packaging unit 7 is shown in FIG. 3 to FIG. 7.

Specifically, the PDU 3, the DC-DC converter 12, and the air conditioner inverter 5 are attached to each of the outer surface sides of heat radiating plates 14 to 16, which have a plurality of heat radiating fins 13 on the back surface side thereof. The heat radiating plate 15 for the DC-DC converter and the heat radiating plate 16 for the air conditioner inverter are disposed so as to oppose the back surface at opposing positions on the back surface of the heat radiating plate 14 for the PDU. In this state, the heat radiating plate 15 of the DC-DC converter and the heat radiating plate 16 of the air conditioner inverter are disposed so that the former is arranged on the upstream side of a passage 18 described below and the later is arranged on the downstream side of the same passage 18. These heat radiating plates 15 and 16 and the heat radiating fins 13 of the opposing heat radiating plate 14 are arranged facing the same direction (longitudinal direction). In the configuration having such an opposed arrangement, the heat radiating plate 14 and the heat radiating plates 15 and 16 are joined by side wall members (connecting members) 17A and 17B, which are substantially U-shaped in cross-section. Each of the side wall members 17A and 17B are joined to the heat radiating plates 14, 15 and 16 so as to cover the side of the heat radiating fins 13 of the mutually opposing heat radiating plates 14, 15, and 16, and in this state, the passage 18, which has a rectangular shape in cross-section, is formed so as to be enclosed by the heat radiating plates 14, 15, and 16 and the side wall members 17A and 17B. The end portion on the side of the heat radiating plate 15 of the passage 18 is connected to the lower opening 8b of the battery 8 (refer to FIG. 9), and heat exchange is carried out between each of the heat radiating plates 14, 15, and 16 and the cooling air that is introduced into the passage 18. Note that the amount of heat dissipation in each of the high voltage electrical devices (the PDU 3, the DC-DC converter 12, the air conditioner inverter 5) is set by the length, height, pitch and the like of the heat radiating fins 13 of each of the high voltage electrical devices.

Figure 6:
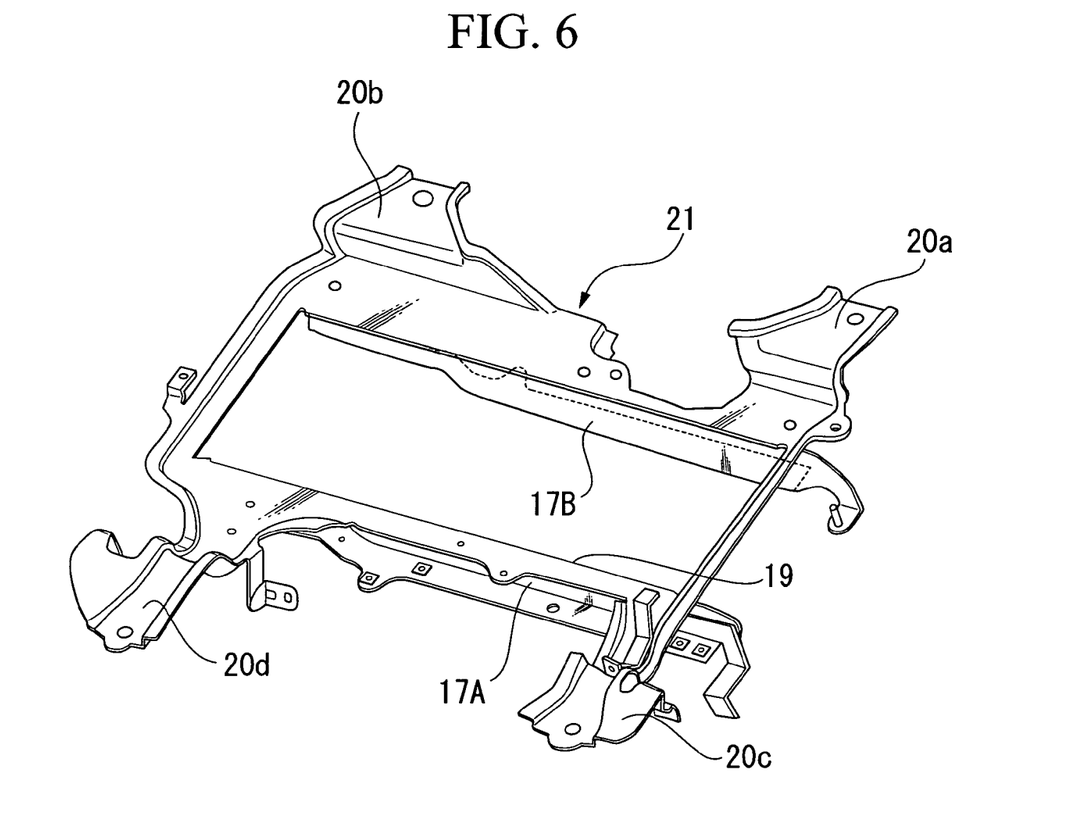
FIG. 6 is a drawing showing the same embodiment, and is a perspective view of the frame.

In addition, as shown in FIG. 6, the side wall members 17A and 17B are integrally attached to a frame 21 having a substantially rectangular opening 19 and four leg portions 20a to 20d for fastening the frame 21 to the vehicle body. The frame 21 is joined by bolt joints or the like to the electrical packaging box 6 such that the longitudinal direction of the opening 19 is aligned with the transverse direction of the vehicle. The heat radiating plate 14 of the PDU 3, which is disposed inside of the electrical packaging box 6 at the back, is directly joined by bolts to the curved portion at one end of the side wall members 17A and 17B, and the heat radiating plates 15 and 16 of the DC-DC converter 12 and the air conditioner inverter 5, which are disposed on the outer side of the electrical packaging box 6, are joined by bolts to the edge portion of the opening 19 and the curved portion at the other end of the side wall portions 17A and 17B by inserting the heat radiating plates 13 into the opening 19 from the outer side of the frame 21. Note that the side wall members 17A and 17B may be integrally formed with the frame 21.

Figure 4:
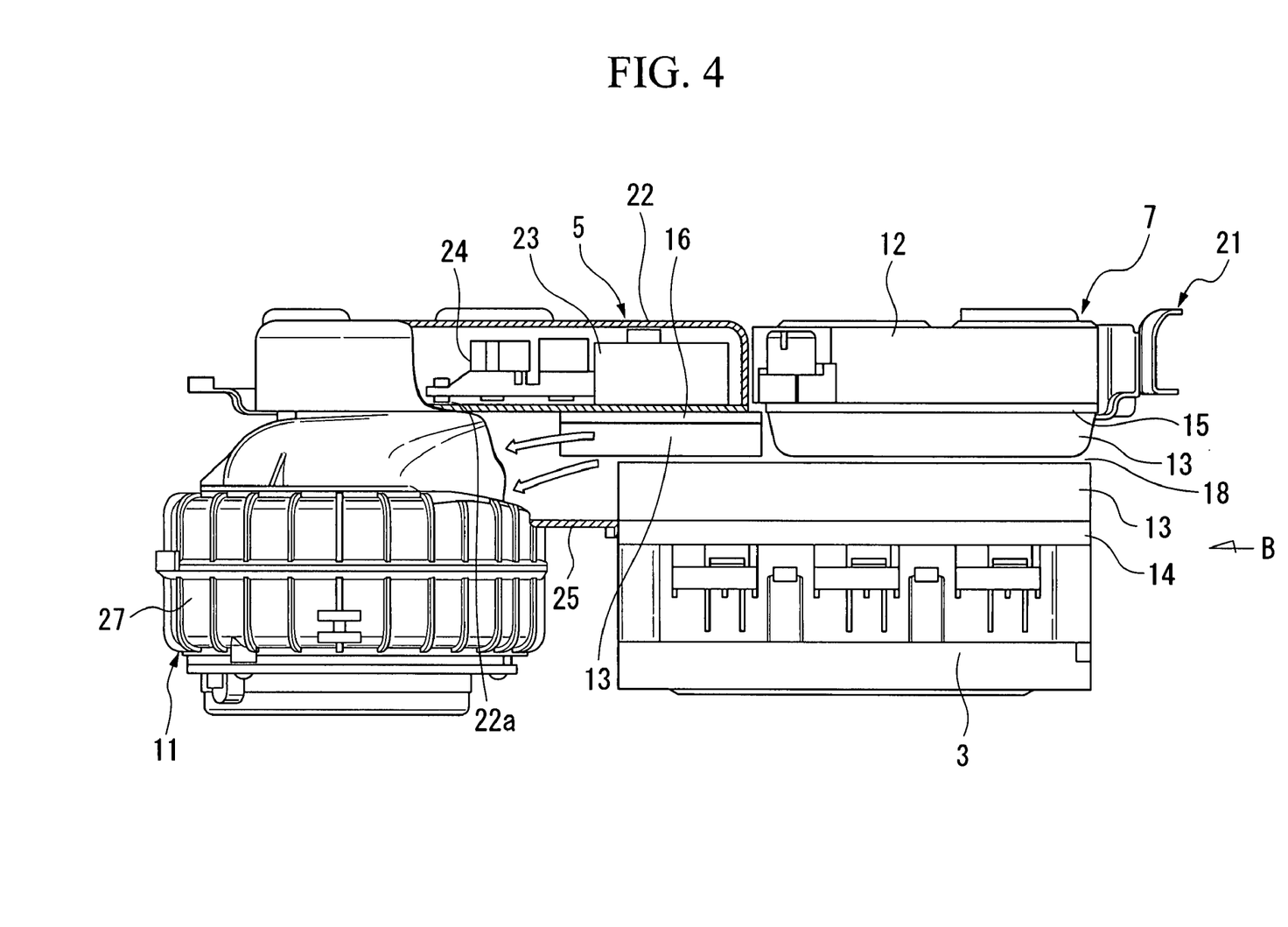
FIG. 4 is a drawing showing the same embodiment, and is a partial cross-sectional view taken along the line A-A in FIG. 3.
Figure 5:
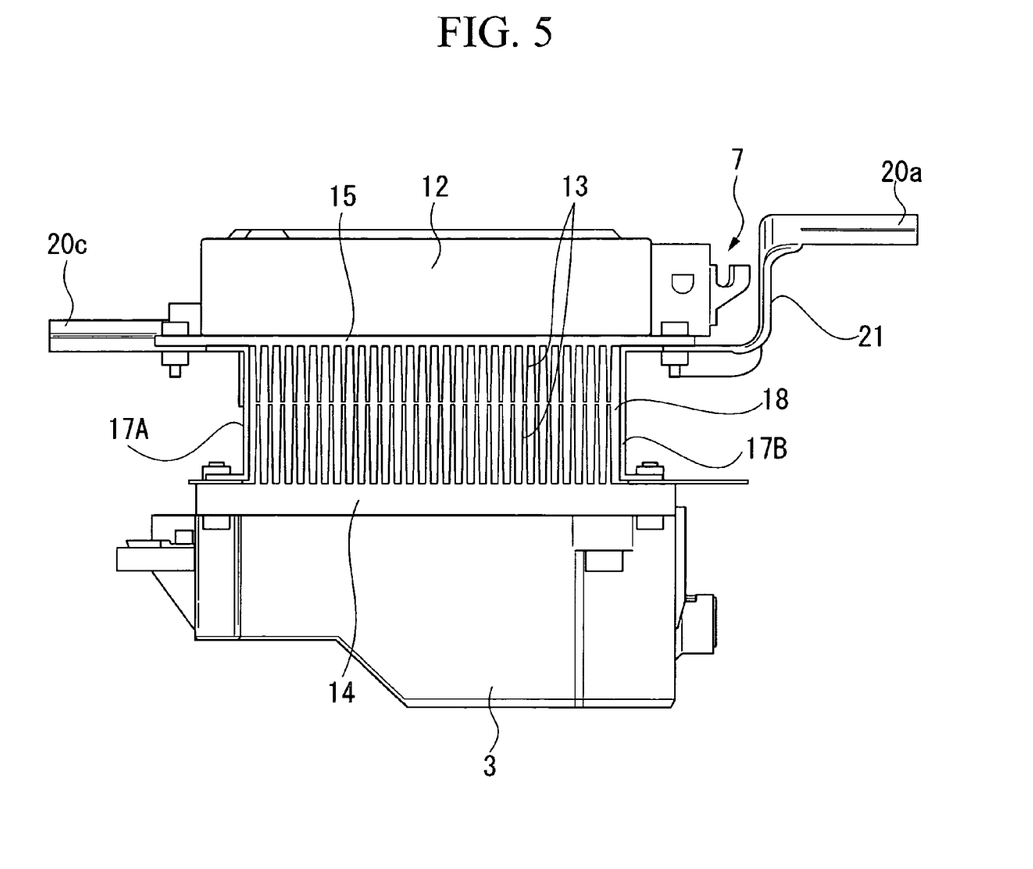
FIG. 5 is a drawing showing the same embodiment, and is a view along the arrow B in FIG. 4.

The air conditioner inverter 5 is disposed in the electrical packaging box 6 so that the longitudinal direction thereof is aligned with the transverse direction of the vehicle. However, as shown in FIG. 4, the heat radiating plate 16 that is mounted on the back surface side of the air conditioner inverter 5 is only provided from an end portion of the air conditioner inverter 5 (the end portion on the right side of the figure) on the side adjacent to the DC-DC converter 12, over an area that extends to about one-third of the inverter 5 in the longitudinal direction. Inside the casing 22 of the air conditioner inverter 5, a high heat radiating part 23 is disposed at a position directly above the heat radiating plate 16, and a low heat radiating part 24, which radiates a comparatively small amount of heat, is disposed in an area offset from the position directly above the heat radiating plate 16. The area of the casing 22 that is offset serves as a low heat radiating parts accommodating portion 22a. In addition, a duct 25 is provided at the end portion of the passage 18 formed by the heat radiating plates 14 to 16 and the side wall members 17A and 17B described above, and the inner surface of the duct 25 is arranged so as to directly face the bottom surface of the low heat radiating parts accommodating portion 22a.

Figure 7:
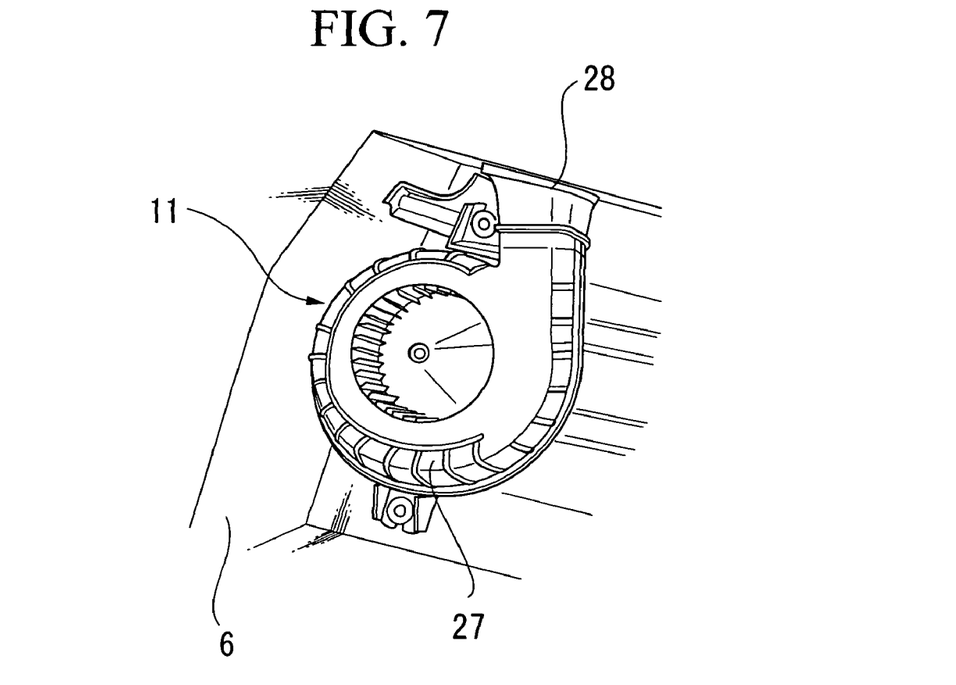
FIG. 7 is a perspective view showing the disposition of a suction fan of the same embodiment.

In contrast, inside the electrical packaging box 6 at the back, the suction fan 11 is disposed at a position opposed to the low heat radiating parts accommodating portion 22a, and the suction portion of the suction fan 11 is connected to the duct 25 at the front surface of the low heat radiating parts accommodating portion 22a. A housing 27 of the fan body of the suction fan 11 is substantially disk-shaped, and the outer circumferential surface of the housing 27 is disposed so as to face the end portion side surface of the PDU 3. The outer circumferential surface of the housing 27 expands so as to reach the back side of the duct 25, and is thereby sufficiently close to the end portion side surface of the PDU 3. In addition, as shown in FIG. 7, a discharge duct 28 for evacuating the suction air to the outside is integrally formed on the outer circumferential surface of the housing 27 so as to project upward.

Figure 8:
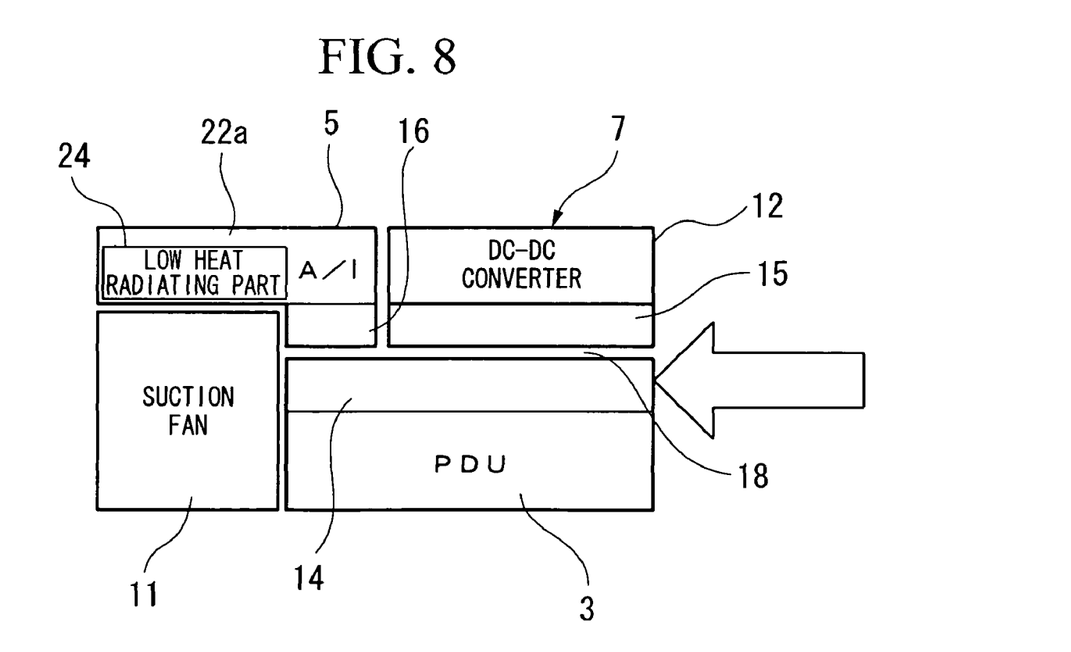
FIG. 8 is a block diagram schematically showing the disposition of the parts of the same embodiment.
Figure 9:
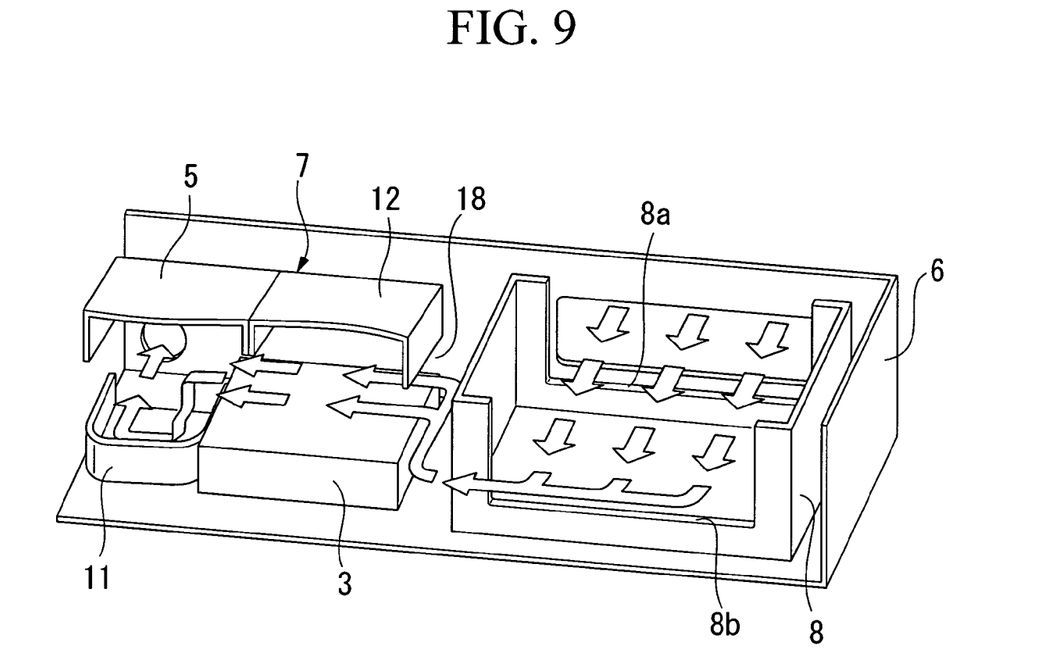
FIG. 9 is a schematic exploded perspective view showing the flow of the cooling air in the same embodiment.

The cooling apparatus of the electrical packaging unit 7 of this embodiment is formed as described above. FIG. 8 is a schematically simplified drawing of the disposition of the structural parts of this apparatus, and FIG. 9 is a schematic drawing of the flow of the cooling air inside the electrical packaging box 6.

As can be understood from these figures, the cooling air that passes through the electrical packaging unit 7 via the battery case 8 carries out the heat exchange between the heat radiating plate 14 of the PDU 3 and each of the heat radiating plates 15 and 16 of the DC-DC converter 12 and the air conditioner inverter 5 disposed on both sides of the passage 18, and subsequently the cooling air is evacuated by the suction fan 11 to the outside. Therefore, the heat of the PDU 3, the DC-DC converter 12, and the air conditioner inverter 5, which are high voltage electrical devices, can be efficiently dissipated when arranged in a concentrated manner so as enclose the passage 18. In particular, in the cooling apparatus of the electrical packaging unit 7, because the DC-DC converter 12, which is indispensable for supplying a vehicle control electrical power source, is disposed along with the PDU 3 upstream in the passage 18, it is possible to cool both efficiently by low temperature cooling air. Thus, it is possible to reduce the size of the DC-DC converter 12 and the PDU 3, whose cooling is prioritized, and their heat radiating plates 15 and 14, and thereby implement a size reduction of the overall apparatus. At the same time, it is possible to increase the reliability of the vehicle control power source.

In addition, in the case of the cooling apparatus of the electrical packaging unit 7, heat radiating plates 14 to 16 are respectively attached to the PDU 3, the DC-DC converter 12, and the air conditioner inverter 5, and in this condition, the heat radiating plate 14 and the heat radiating plates 15 and 16 are placed back-to-back, and each is joined to a side wall member 17A and 17B. Thereby, the passage 18 can be easily defined. In addition, because the structural components that form the passage 18 have comparatively simple shapes, the passage 18 is easily manufactured in comparison to the case in which the passage 18 is formed by integrated parts. In particular, because the passage 18 of this embodiment is one in which the side wall members 17A and 17B are formed having a U-shape in cross-section and integrally joined to the frame 21, the side wall members 17A and 17B can be joined to the frame 21 in advance. In this state, if the heat radiating plates 14, 15, and 16 are each installed on the side wall members 17A and 17B, the formation of the passage 18 and the installation of the high voltage electrical devices such as the PDU 3 are simultaneously completed, and the installation operation is thereby further simplified.

Therefore, when this cooling apparatus is used, due to the space-saving disposition of the high voltage electrical components and the simplification of the manufacture and installation, it is possible to make the apparatus compact and to reduce the manufacturing costs.

Furthermore, in this embodiment, because the low heat radiating parts accommodating portion 22a of the air conditioner inverter 5 disposed downstream in the passage 18 is extended forward so as to project beyond the heat radiating plate 16, and the suction fan 11 is disposed so as to oppose the low heat radiating parts accommodating portion 22a, the suction fan 11 can be disposed, in a space-saving manner, in the substantially rectangular space enclosed by the back surface portion that is not occupied by the heat radiating plate 16 of the air conditioner inverter 5 and the end portion side surface of the PDU 3. Thereby, it is possible to dispose the entire apparatus compactly inside the electrical packaging box 6, and it becomes possible to make more effective use of the vehicle spaces such as the trunk space.

In addition, in this embodiment, because a duct 25 is disposed on the extension of the heat radiating plates 14 and 16 and the outer circumferential surface of the housing 27 of the suction fan 11 surrounds the back portion of the duct 25 so as to reach the PDU 3, it is possible to arrange the duct 25, the suction fan 11, the PDU 3 and the like in a more concentrated manner. Therefore, this also contributes significantly to making the apparatus compact.

In addition, in this embodiment, because the discharge duct 28 is integrally formed with the housing 27 of the suction fan 11 and projects upward toward the electrical packaging box 6, in comparison to the case in which a separate discharge duct is connected to the suction fan 11, the number of parts can be decreased, and thereby it is possible to implement a reduction in the manufacturing cost and a further reduction in the size of the apparatus.

In the first embodiment explained above, the high voltage electrical devices of the electrical packaging unit 7 include the PDU 3 (inverter), the DC-DC converter 12, the air conditioner inverter 5 (the electric power converter for driving the electrical accessories) and the like, but the high voltage electrical devices that can use the cooling apparatus for the electrical packaging unit according to the present invention and the combination of the arrangement thereof is not limited to those that have been explained here. For example, it is possible to use those of the second through fourth embodiments shown respectively in FIG. 11 to FIG. 13. Below, in the explanation of the second through fourth embodiments, parts identical to those of the first embodiment described above are denoted by the same reference symbols, and redundant explanations have been omitted.

Second Embodiment

Figure 11:
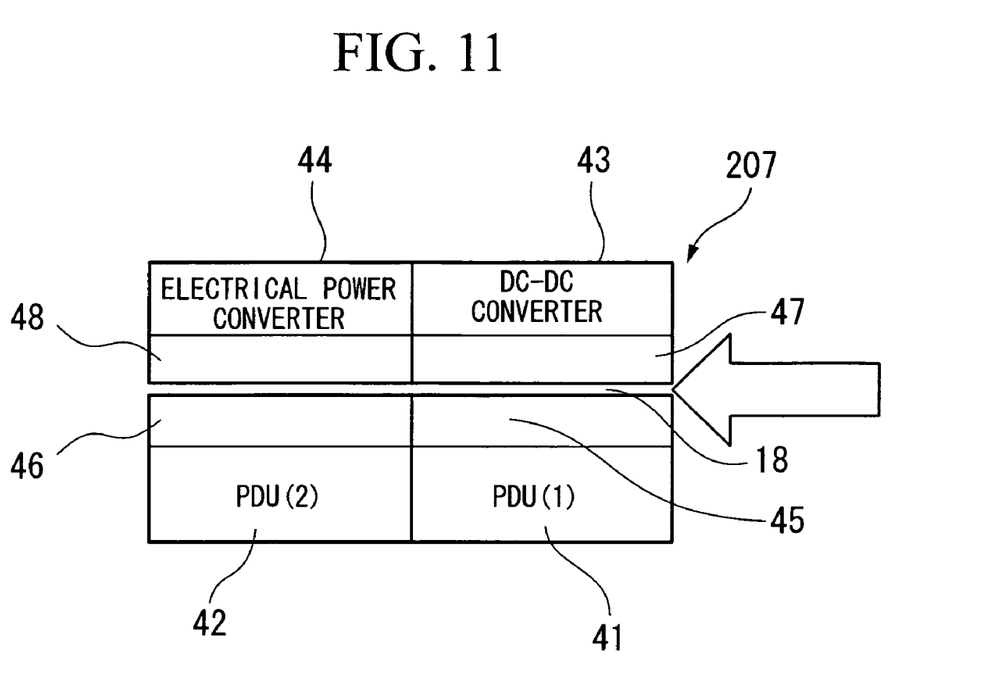
FIG. 11 is a block diagram schematically showing the disposition of the parts of a second embodiment of the present invention.

FIG. 11 shows a second embodiment.

An electrical packaging unit 207 of this embodiment is used in a vehicle provided with two vehicle drive motors, and is provided with two PDUs 41 and 42 having invertors for each motor, a DC-DC converter 43 for the vehicle control power source, and the electrical power converter 44 for driving the electrical accessories. The PDUs 41 and 42, the DC-DC converter 43, and the electrical power converter 44 are respectively mounted on heat radiating plates 45 to 46, which have heat radiating fins, and the two heat radiating plates 45 and 46 of the PDUs 41 and 42 are adjacent to each other. The heat radiating plate 47 of the DC-DC converter 43 and the heat radiating plate 48 of the electrical power converter 44 are respectively disposed adjacent to positions opposed to the heat radiating plates 45 and 46 of the PDUs 41 and 42, that is, the heat radiating plate 47 for the DC-DC converter 43 is on the upstream side, and the heat radiating plate 48 for the electrical power converter 44 is on the downstream side. Note that electrical accessories driven by the electrical power converter 44 denote, for example, electrical devices such as the motor for driving the compressor.

Third Embodiment

Figure 12:
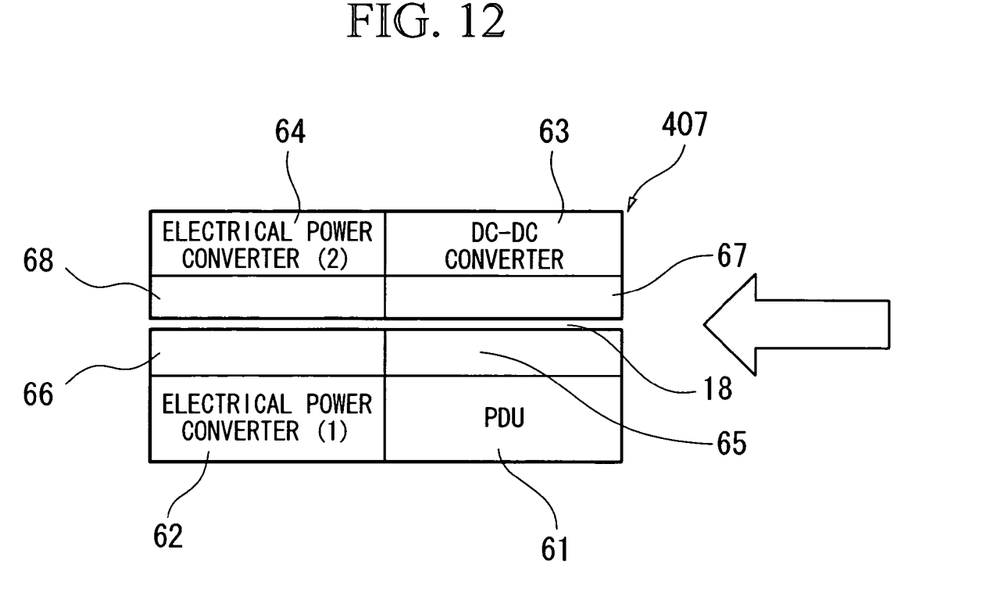
FIG. 12 is a block diagram schematically showing the disposition of the parts of a third embodiment of the present invention.

FIG. 12 shows a third embodiment.

An electrical packaging unit 407 of this embodiment is provided with one PDU 61 having one inverter for a vehicle drive motor, a DC-DC converter 63 for a vehicle control power source, and two electrical power converters 62 and 64 for driving electrical accessories. The PDU 61, the electrical power converter 62, the DC-DC converter 63, and the electrical power converter 64 are respectively mounted on heat radiating plates 65 to 68, and the heat radiating plate 66 of the electrical power converter 62 is disposed adjacent on the downstream side of the heat radiating plate 65 of the PDU 61. Each of the heat radiating plates 67 and 68 of the DC-DC converter 63 and the electrical power converter 64 are disposed adjacent to each other at positions opposed to the heat radiating plate 65 of the PDU 61 and the heat radiating plate 66 of the electrical power converter 62.

Fourth Embodiment

Figure 13:
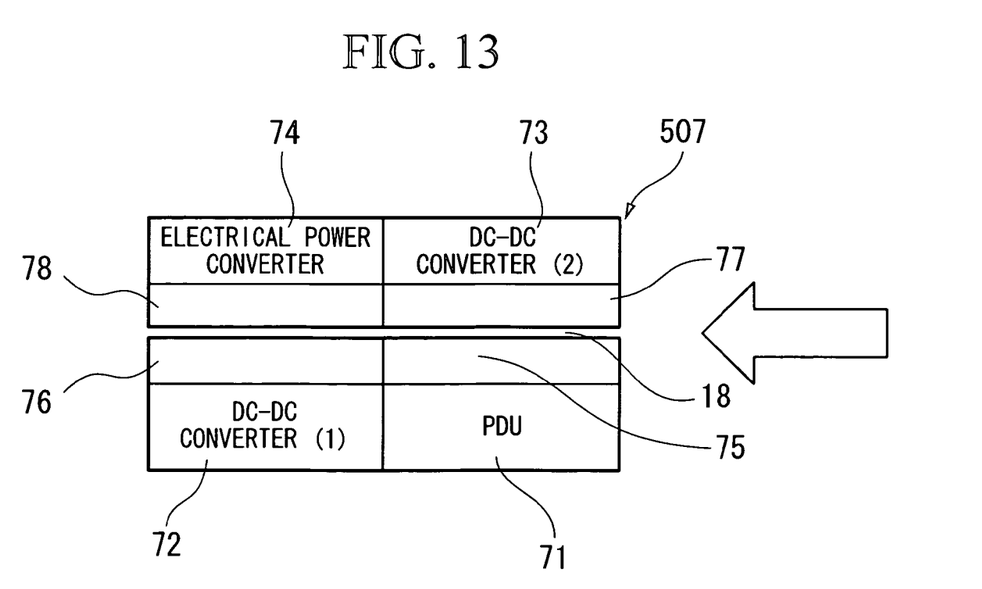
FIG. 13 is a block diagram showing schematically the disposition of the parts of a fourth embodiment of the present invention

FIG. 13 shows a fourth embodiment.

An electrical packaging unit 507 of this embodiment is provided with one PDU 71 having an inverter for a vehicle drive motor, a step-up DC-DC converter 72, a step-down DC-DC converter 73 for the vehicle control power source, and an electrical power converter 74 for driving the electrical accessories. The PDU 71, the DC-DC converters 72 and 73, and the electrical power converter 74 are respectively mounted on heat radiating plates 75 to 78, and disposed such that the heat radiating plate 76 of the DC-DC converter 72 is adjacent to the downstream side of the heat radiating plate 75 of the PDU 71. Each of the heat radiating plates 77 and 78 for the DC-DC converter 73 and the electrical power converter 74 are disposed adjacent to the positions opposed to the heat radiating plates 75 and 76 such that the heat radiating plate 77 of the DC-DC converter 73 is on the upstream side of the heat radiating plate 78 of the electrical power converter 74.

Note that the present invention is not limited by the embodiments described above, and various design modifications are possible that do not depart from the spirit of the invention.

What is claimed is:

1. A cooling apparatus for a vehicle electrical packaging unit that introduces cooling air into an electrical packaging unit that comprises a first high voltage electrical device, a second high voltage electrical device, and a third high voltage electrical device, and cools the first high voltage electrical device, the second high voltage electrical device and the third high voltage electrical device by heat exchange with the cooling air, the cooling apparatus comprising:

a first heat radiating plate installed on the first high voltage electrical device and provided with heat radiating fins on a back surface thereof;

a second heat radiating plate installed on the second high voltage electrical device, provided with radiating fins on a back surface thereof, and disposed such that said back surface of said second heat radiating plate opposes said back surface of said first heat radiating plate;

a third heat radiating plate installed on the third high voltage electrical device, provided with heat radiating fins on a back surface thereof, and disposed such that said back surface of said third heat radiating plate opposes said back surface of said first heat radiating plate and downstream of said second heat radiating plate when viewed in a direction of flow of the cooling air;

connecting members that respectively connect said first heat radiating plate to said second heat radiating plate, and said first heat radiating plate to said third heat radiating plate, each of said connecting members covering a side of an outer-most heat radiating fin among said heat radiating fins along a length thereof;

a low heat radiating parts accommodating portion that is disposed at an area downstream of the air passage, and projects in a downstream direction from an end portion of one of the first heat radiating plate and the third heat radiating plate; and a suction fan for introducing cooling air that is adjacent to the other end portion of the first heat radiating plate and the third heat radiating plate and disposed so as to oppose the low heat radiating parts accommodating portion;

wherein said heat radiating fins on said back surface of said second heat radiating plate project towards said heat radiating fins on said back surface of said first heat radiating plate, wherein said heat radiating fins on said back surface of said third heat radiating plate project towards said heat radiating fins on said back surface of said first heat radiating plate, and wherein each of said heat radiating fins is enclosed by said first heat radiating plate, said second heat radiating plate, said third heat radiating plate, and said connecting members to form an air passage through which the cooling air passes.

2. The cooling apparatus of a vehicle electrical packaging unit according to claim 1, further comprising:

a duct disposed on an extension of the first heat radiating plate and the second heat radiating plate to connect the air passage and the suction fan, wherein a fan body of the suction fan is disposed so as to be adjacent to a side portion of either one of the first high voltage electrical device and the third high voltage electrical device.

3. The cooling apparatus for a vehicle electrical packaging unit according to claim 1, further comprising:

a discharge duct that is formed integrally with a housing of the suction fan and that evacuates the cooling air.

4. The cooling apparatus for a vehicle electrical packaging unit according to claim 1, wherein a frame for attaching at least one of the first high voltage electrical device, the second high voltage electrical device and the third high voltage electrical device to another part member is integrally formed with at least one of the connecting members.

5. The cooling apparatus for a vehicle electrical packaging unit according to claim 1, wherein the first high voltage electrical device is an inverter for a vehicle drive motor, wherein the second high voltage electrical device is a DC-DC converter for a vehicle control power source, and wherein the third high voltage electrical device is a electrical power converter for driving electrical accessories.

6. The cooling apparatus for a vehicle electrical packaging unit according to claim 2, wherein the first high voltage electrical device is an inverter for a vehicle drive motor, wherein the second high voltage electrical device is a DC-DC converter for a vehicle control power source, and wherein the third high voltage electrical device is a electrical power converter for driving electrical accessories.

7. The cooling apparatus for a vehicle electrical packaging unit according to claim 3, wherein the first high voltage electrical device is an inverter for a vehicle drive motor, wherein the second high voltage electrical device is a DC-DC converter for a vehicle control power source, and wherein the third high voltage electrical device is a electrical power converter for driving electrical accessories.

8. The cooling apparatus for a vehicle electrical packaging unit according to claim 4, wherein the first high voltage electrical device is an inverter for a vehicle drive motor, wherein the second high voltage electrical device is a DC-DC converter for a vehicle control power source, and wherein the third high voltage electrical device is a electrical power converter for driving electrical accessories.

9. The cooling apparatus for a vehicle electrical packaging unit according to claim 1, wherein the air passage has a rectangular shape in cross-section, when viewed in the direction of flow of the cooling air.

* * * * *